(12) United States Patent
Miyazaki et al.

(10) Patent No.: US 6,640,198 B2
(45) Date of Patent: Oct. 28, 2003

(54) SEMICONDUCTOR DEVICE HAVING SELF TEST FUNCTION

(75) Inventors: Masahide Miyazaki, Hachioji (JP);
Kazumi Hatayama, Hachioji (JP);
Kazunori Hikone, Naka (JP); Seiji Kobayashi, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 188 days.

(21) Appl. No.: 09/941,754

(22) Filed: Aug. 30, 2001

(65) Prior Publication Data

US 2002/0128794 A1 Sep. 12, 2002

(30) Foreign Application Priority Data

Mar. 9, 2001 (JP) ........................................ 2001-066012

(51) Int. Cl.⁷ ................................................ G06F 11/25
(52) U.S. Cl. ........................................ 702/118; 714/30
(58) Field of Search ................................ 702/118, 119, 702/120, 182, 183, 188; 341/122, 124; 438/5, 18; 714/100, 2, 5, 10, 30, 31, 36, 25, 26, 6, 7; 369/47.23

(56) References Cited

U.S. PATENT DOCUMENTS

| | | | | |
|---|---|---|---|---|
| 5,189,675 A | * | 2/1993 | Nozuyama et al. | 714/726 |
| 5,495,486 A | * | 2/1996 | Gheewala | 714/724 |
| 5,732,209 A | * | 3/1998 | Vigil et al. | 714/30 |
| 6,240,537 B1 | * | 5/2001 | Sim | 714/732 |
| 6,333,706 B1 | * | 12/2001 | Cummings et al. | 341/129 |
| 6,424,926 B1 | * | 7/2002 | Mak | 702/117 |

FOREIGN PATENT DOCUMENTS

JP  10171676  12/1999

OTHER PUBLICATIONS

K. Batcher et al, "Instruction Randomization Self Test for Processor Cores," 17th VLSI Test Symposium Proceedings, pp. 34–40, 1999.
A Tutorial on Built–In Self–Test, Part 1: Principles, IEEE Design & Test of Computers, pp. 73–82, Mar., 1993.
A Tutotal on Built–In Self–Test, Part 2: Applications, IEEE Design & Test of Computers, pp. 69–77, Jun., 1993.

* cited by examiner

Primary Examiner—Marc S. Hoff
Assistant Examiner—Edward Raymond
(74) Attorney, Agent, or Firm—Mattingly, Stanger & Malur, P.C.

(57) ABSTRACT

The present invention relates to an LSI which performs a self test using its built-in test function according to a test program stored in an on-chip memory. An object of the present invention is to efficiently perform the self test in the case where branching to an address out of the address space of the on-chip memory occurs.

A program counter 101 stores addresses of a memory 117 and an external memory. A test program counter 108 stores an address of the memory 117. In a test mode, a program counter switching section 109 performs control so that when an address of the memory 117 is detected in the program counter 101, the address value of the program counter 101 is selected, whereas when an address of the external memory is detected in the program counter 101, the address value of the test program counter 108 is selected. A signature compression circuit 110 signature-compresses and holds the output value of the program counter 101.

12 Claims, 7 Drawing Sheets

SEMICONDUCTOR DEVICE HAVING SELF TEST FUNCTION

FIELD OF THE INVENTION

The present invention relates to a semiconductor device having a self test function to perform a test using a test program stored in an on-chip memory and random number data. More particularly, the present invention relates to a technique for efficiently performing the test in the case of occurrence of branching to an address space which does not exist on a chip, such as the address space of an external memory.

BACKGROUND OF THE INVENTION

As the speed of processors has been increased, it has become more and more difficult to test processors at an ordinary operation speed (at speed). Especially, in the case of the "system-on-chip" configuration, the processor embedded within the LSI as a core has a core interface which is not connected to an LSI pin, making it difficult to test the processor at speed. In this connection, in recent years, there has been a growing interest in the built-in self test method employing a mechanism in which instructions and random number data are generated at speed within an LSI and the random number data is supplied to a processor, as well as employing a processor instruction execution function in which a signature compressor holds the output responses from the processor.

One technique for realizing the built-in self test method using an instruction execution function owned by a processor is discussed in the 17th VLSI Test Symposium Proceedings in 1999 (pp. 34–40). This technique is hereinafter referred to as "Prior Art Example 1". This method (technique) comprises hardware for dynamically rewriting a program and a signature compressor for compressing and holding the output of a processor, and divides the program area on a memory into a rewrite-target program and a fixed program. When the rewrite-target program is being executed, instructions and operands are dynamically rewritten, whereas when the fixed program is being executed, operation results stored on the registers are output by use of a store instruction and held by the signature compressor. At the end of the test, an internal state held in the signature compressor is compared with an expected value obtained through simulation beforehand to determine whether the processor is nondefective or defective. In this method, it is possible to change the instruction execution order and operands in order to examine occurrence of various faults. Furthermore, since this method does not require any additional circuit within the processor, it is not liable to suffer lowered performance as compared with the conventional built-in self test method, making it easy to realize at-speed operation. However, this method does not take into consideration processors which access a memory outside the chip through an external memory interface, and therefore does not put any restriction on the address space to be used.

One method for the self test using an on-chip memory performs a self test by use of a cache memory. This method is disclosed in Japanese Laid-Open Patent Publication No. 10-171676 (1998). This method is hereinafter referred to as "Prior Art Example 2". It should be noted that a built-in self test technique is discussed on pages 73 through 82 of the March issue of IEEE DESIGN & TEST OF COMPUTER in 1993, and on pages 69 through 77 ("A Tutorial on Built-In Self-Test") of the June issue of the same magazine in 1993.

Prior Art Example 1 (a built-in self test method using an instruction execution function owned by a processor) has a problem in that in the case of processors which access a memory outside the chip through an external memory interface, only on-chip memories can be used in a screening test, making it impossible to efficiently perform the test. For example, in the case of checking branch instructions, since random number data is used, branching to an address in an external memory space which does not exist at the time of the screening test may occur.

Generally, when a branch instruction for branching to an invalid address or undefined code is fetched, the processor executes a series of exception processing codes. Therefore, in Prior Art Example 1, exception processing is frequently carried out, considerably lowering the test efficiency.

On the other hand, to avoid occurrence of exception processing, Prior Art Example 2 uses an address conversion circuit to convert an address signal (which indicates an invalid address) so that it indicates an address in a valid address space of an internal memory. However, in Prior Art Example 2, if this address conversion is applied to a fetch address signal, it is not possible to tell whether the signal indicates the proper branch destination address, making it impossible to sufficiently check the branch instruction function.

As is obvious from the above description, in the case of performing a built-in self test on a microprocessor having an external memory by use of a test program stored in an on-chip memory, in order to efficiently perform the test including a test on a function to use the address space of an external memory, it is necessary to observe generation of an address signal specifying the external memory as well as converting an actual output address signal into a valid address signal.

The present invention relates to a processor performing a built-in self test by use of a program stored in an on-chip memory, and an object of the present invention is to provide a means for observing a signal specifying an address of an external memory when the signal has been generated, and a means for outputting a valid address as an actual address signal in order to efficiently perform the test.

SUMMARY OF THE INVENTION

The present invention provides a semiconductor device which includes an on-chip memory and a processor, the processor comprising: a program counter for storing an address in an address space of the on-chip memory and an external memory; a test program counter for storing an address in an address space of the on-chip memory; program counter switching means for, in a test mode, performing control in such a way that when an address of the on-chip memory is detected in the program counter, the address value in the program counter is selected as an address to be accessed in the on-chip memory, whereas when an address of the external memory is detected in the program counter, an address value of the test program counter is selected; and signature compression means for signature-compressing and holding an output value of the program counter.

DETAILED DESCRIPTION OF THE PREFERRED EMBODIMENTS

Preferred embodiments of the present invention will be described below with reference to the accompanying drawings.

Figure 1:
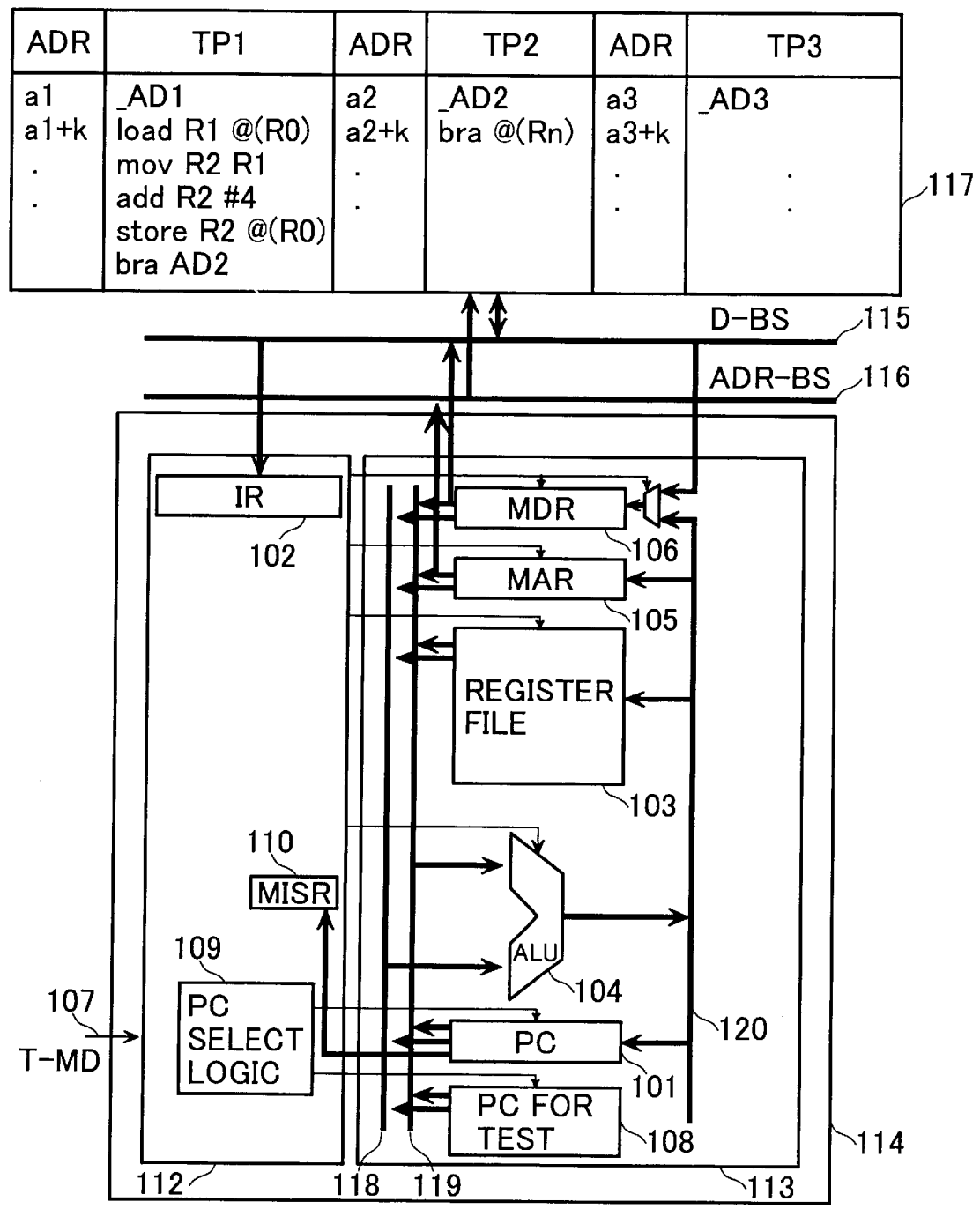
FIG. 1 is a diagram showing the configuration of an LSI according to an embodiment of the present invention.

FIG. 1 is a diagram showing the configuration of an LSI according to an embodiment of the present invention. This LSI has a processor 114 and an on-chip memory 117 therein. The processor 114 is a standard general-purpose "register machine". In an ordinary operation to fetch an instruction or an operand, an output value from a program counter (PC) 101 within a data path 113 is transferred to a memory address register (MAR) 105 through inter-register transfer busses 118 and 119, an arithmetic operation unit 104, and an inter-register transfer bus 120, and an instruction code is stored from an address specified by a program on a memory 117 through an address bus (ADR-BS) 116 into an instruction register (IR) 102 within a control circuit 112. The instruction code is then decoded and executed.

If the present instruction is a load instruction, an address of the memory 117 or of an external memory is stored in the memory address register 105, and data transferred from the memory 117 or the external memory through a data bus (D-BS) 115 is stored in a memory data register (MDR) 106 before the data is stored in a given register in a register file 103. If the present instruction is an inter-register operation instruction, the values stored in the register file are transferred to the arithmetic operation unit 104 through inter-register transfer busses 118 and 119, and the operation result is stored in the register file through the inter-register transfer bus 120. If the present instruction is a store instruction, a memory address is stored in the memory address register 105, and data to be transferred to the memory is stored from a given register in the register file into the memory data register before the memory is accessed.

FIG. 1 shows an LSI having a configuration in which the ordinary processor configuration described above is added with a test mode signal (T-MD) 107, a test program counter 108, a program counter switching section 109, and a signature compression circuit (MISR) 110. The test mode signal 107 supplies a test mode signal to the program counter switching section 109 and the signature compression circuit 110 in the test mode. The test program counter 108 stores an address within the address space of the on-chip memory 117. The program counter switching section 109 switches between the program counter 101 and the test program counter 108. The signature compression circuit 110 compresses and holds the output value of the program counter 101 in the test mode.

When the test program in the memory 117 has a branch instruction, its branch destination address is stored in the program counter 101. This branch destination address indicates an address (ADR) of the memory 117 or an address within the address space of the external memory. The signature compression circuit 110 compresses and holds the output value of the program counter 101 in the test mode. The program counter switching section 109, on the other hand, performs control so that when an address of the external memory is detected to be in the program counter 101 in the test mode, the transfer of the output value of the program counter 101 to the inter-register transfer bus 120 is disabled, and the output value of the test program counter 108 is transferred to the inter-register transfer bus 120 instead. With this arrangement, even when an invalid address (that is, an address out of the address space of the memory 117) is specified, it is possible to continue the test without causing address exception processing to occur. Furthermore, since the signature compression circuit 110 compresses and holds the output value of the program counter 101, it is possible to test an output response on a branch instruction.

Description will be made of the meanings of the instructions indicated in the test programs (TP1, TP2, and TP3) shown in FIG. 1. Numerals AD1, AD2, and AD3 are symbols indicating the locations of addresses a1, a2, and a3, respectively. The expression "load R1 @ (R0)" is an instruction for loading onto a register R1 the operand at the location indicated by the address stored in a register R0. The symbol "@" denotes indirect addressing. The expression "mov R2 R1" is an instruction for moving the operand stored in the register R1 into a register R2. The expression "add R2 #4" is an instruction for directly adding a numerical value of 4 to the contents of the register R2. The expression "store R2 @ (R0)" is an instruction for storing the contents of the register R2 into the location indicated by the address stored in the register R0. The expression "bra AD2" is an instruction for branching to the address a2 of the memory 117. The expression "bra @ (Rn)" is an instruction for branching to an address indirectly referenced by a register Rn. The register Rn may store an address of the external memory.

Figure 2:
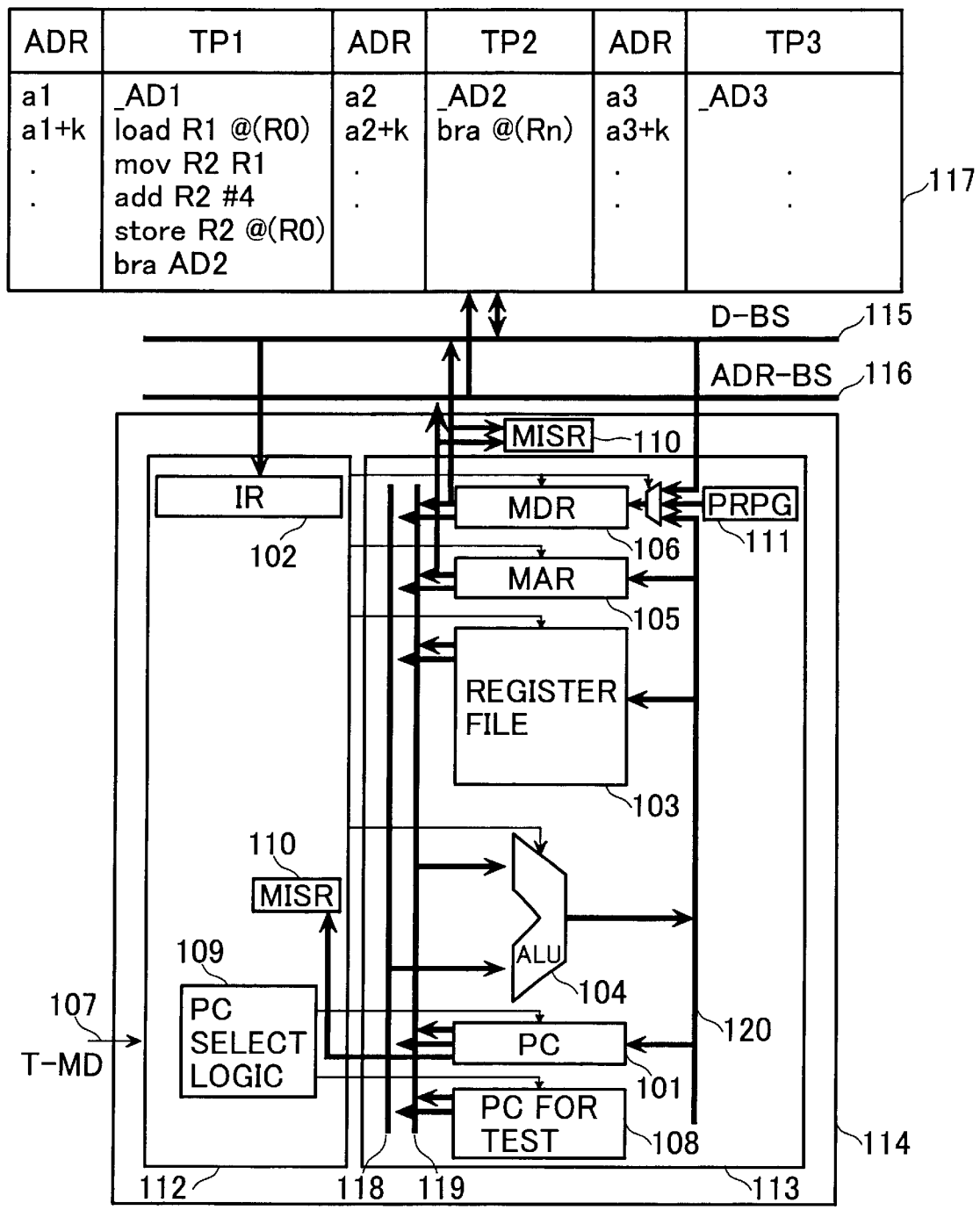
FIG. 2 is a diagram showing the configuration of an LSI according to another embodiment of the present invention.

FIG. 2 shows an LSI having a configuration in which a random number data generating circuit (PRPG) 111 is added to the configuration shown in FIG. 1. The random number data generating circuit 111 inputs random number data to the memory data register 106 in the test mode. Furthermore, in the test mode, the output values of the program counter 101, the memory address register 105, and the memory data register 106 are input to the signature compression circuit 110 which compresses and holds them.

In the test mode, when a load instruction is issued, data in a memory is not transferred to the memory data register 106. The memory data register 106 stores random number data output from the random number data generating circuit 111 instead. In this configuration, when data is supposed to be fetched from a memory, random number data is fetched instead. With this, it is possible to test the functions of the processor using various input data for a same test program. Furthermore, the signature compression circuit 110 receives the output values of the program counter 101, the memory address register 105, and the memory data register 106 so as to hold output responses to memory access operation.

In the configuration shown in FIG. 2, in the test mode, when a load instruction to load data stored in a memory into the register Rn is fetched from the memory 117 and executed, the data is not input to the memory data register 106. Random number data generated by the random number data generating circuit 111 is input to the memory data register 106 and loaded into the register Rn instead. Subsequently, when a branch instruction indirectly referencing the register Rn is fetched and executed, the random number data generated as a branch destination address is stored into the program counter 101. Since the signature compression circuit 110 holds the output value of the program counter 101, it is possible to test an output response on a branch instruction. On the other hand, upon detecting an address of the external memory stored in the program counter 101 in the test mode, the program counter switching section 109 performs control so that the output value of the test program counter 108 is transferred to the inter-register transfer bus 120. With this arrangement, even when the generated random number data is an invalid address (that is, an address out of the address space of the memory 117), it is possible to continue the test without causing address exception processing to occur.

Figure 3:
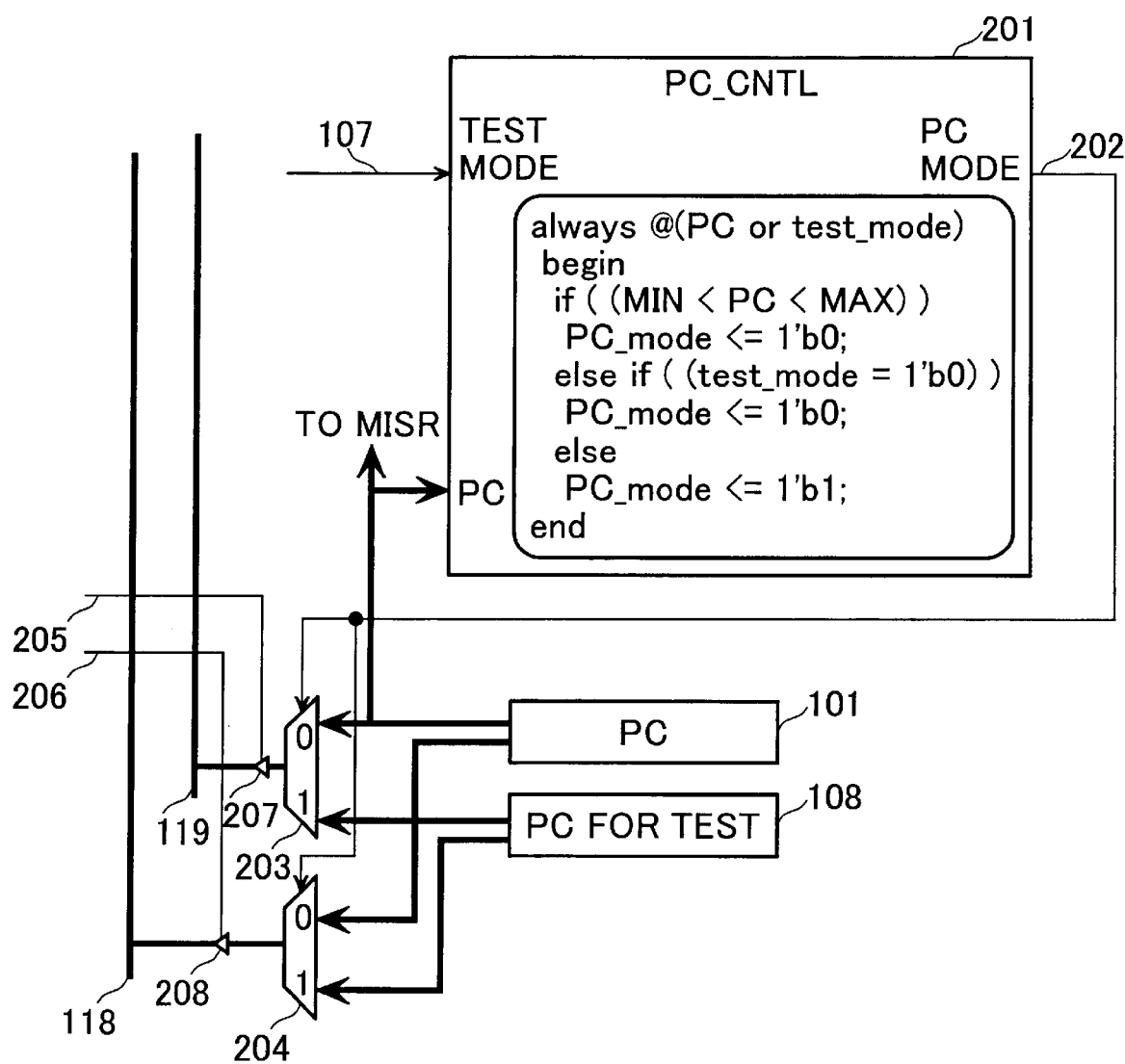
FIG. 3 is a diagram showing the configuration of a program counter switching section 109 according to an embodiment of the present invention.

FIG. 3 is a diagram showing an internal configuration of the program counter switching section 109, which controls the program counter 101 and the test program counter 108. The program counter switching section 109 comprises a program counter control circuit 201 for generating and outputting a program counter switching signal 202, and multiplexer logics 203 and 204 for selecting between the program counter 101 and the test program counter 108 based on the program counter switching signal 202. The program counter control circuit 201 receives the test mode signal 107 and part of the address value stored in the program counter 101. Control signals 205 and 206 control tristate gates 207 and 208 so as to select busses 119 and 118 as a bus for transferring an address, respectively.

The operation of the program counter control circuit 201 is expressed by use of pseudocode of a hardware description language. The expression "always @ (PC or test-mode)" indicates the following operation performed when the value of the program counter 101 or the test mode signal 107 has been changed. If the value of the program counter 101 is within the valid range (MIN<PC<MAX), a "0" bit is output as the program counter switching signal 202. In the case where the value of the program counter 101 is out of the valid range, on the other hand, if the test mode signal 107 is 0, a "0" is output as the program counter switching signal 202. If the test mode signal 107 is not 0, a "1" is output as the program counter switching signal 202. When the program counter switching signal 202 is a "1", the multiplexer logics 203 and 204 select the output value of the test program counter 108.

Configured as described above, the program counter switching section 109 selects the ordinary program counter 101 for the test as long as the value of the program counter 101 is within the valid range. Therefore, it is possible to restrict the use of the test program counter 108 to cases in which an invalid address has been specified, simplifying the setting of the test program counter 108. For example, a fixed address may be set in the test program counter 108. If a fixed address is set in the test program counter 108 in the test mode, and an indirectly-referencing branch instruction as described above is executed, it is possible to always branch to the fixed address of the memory 117 when the branch address is invalid. That is, testing of the branch instructions on the test program can be separated from testing of other instructions.

Figure 4:
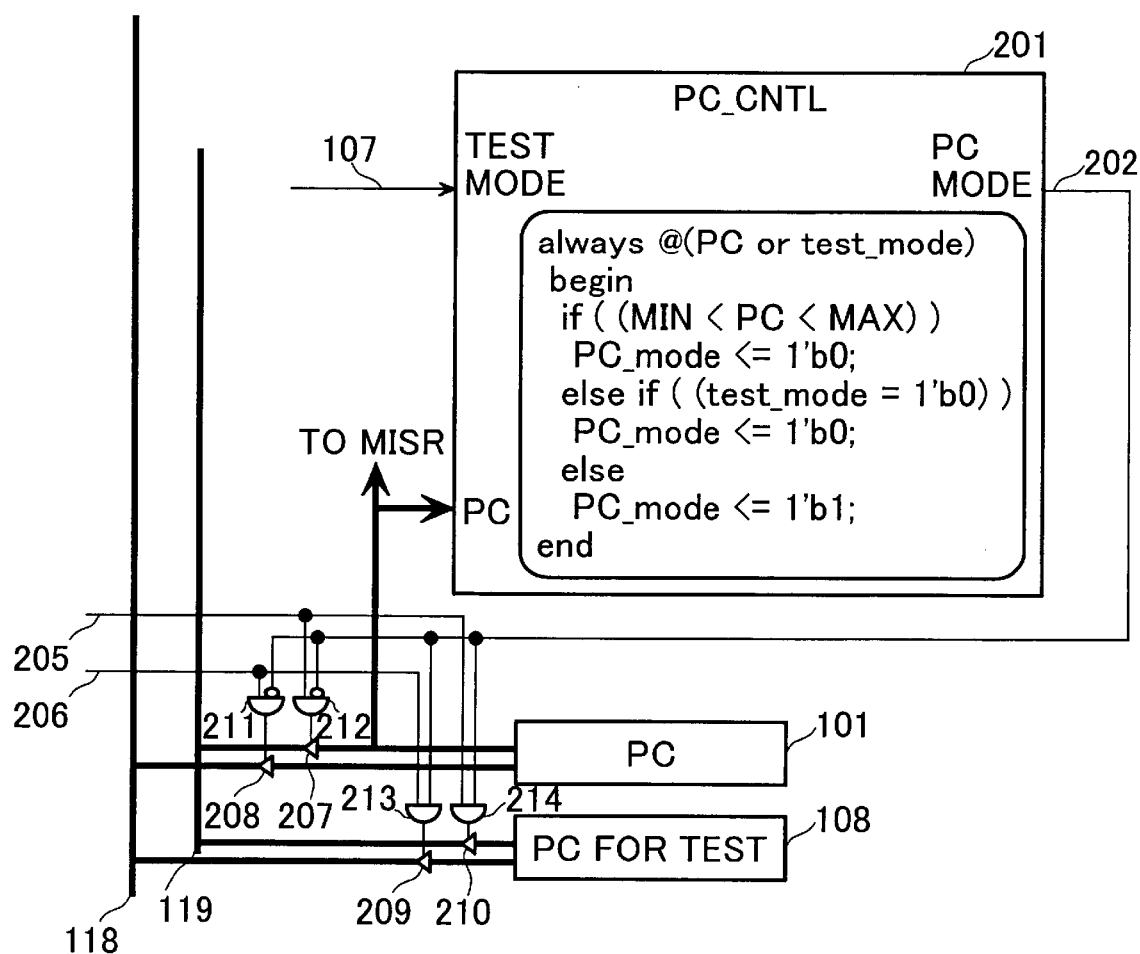
FIG. 4 is a diagram showing the configuration of a program counter switching section 109 according to another embodiment of the present invention.

FIG. 4 is a diagram showing another configuration of the program counter switching section 109. The configuration of the program counter control circuit 201 is the same as that shown in FIG. 3. This configuration of the program counter switching section 109 uses gate circuits 211, 212, 213, and 214 instead of the multiplexer logics 203 and 204. Even though this configuration is functionally equivalent to that of FIG. 3, it does not include any multiplexer in the data transfer route, reducing the delay overhead.

Figure 5:
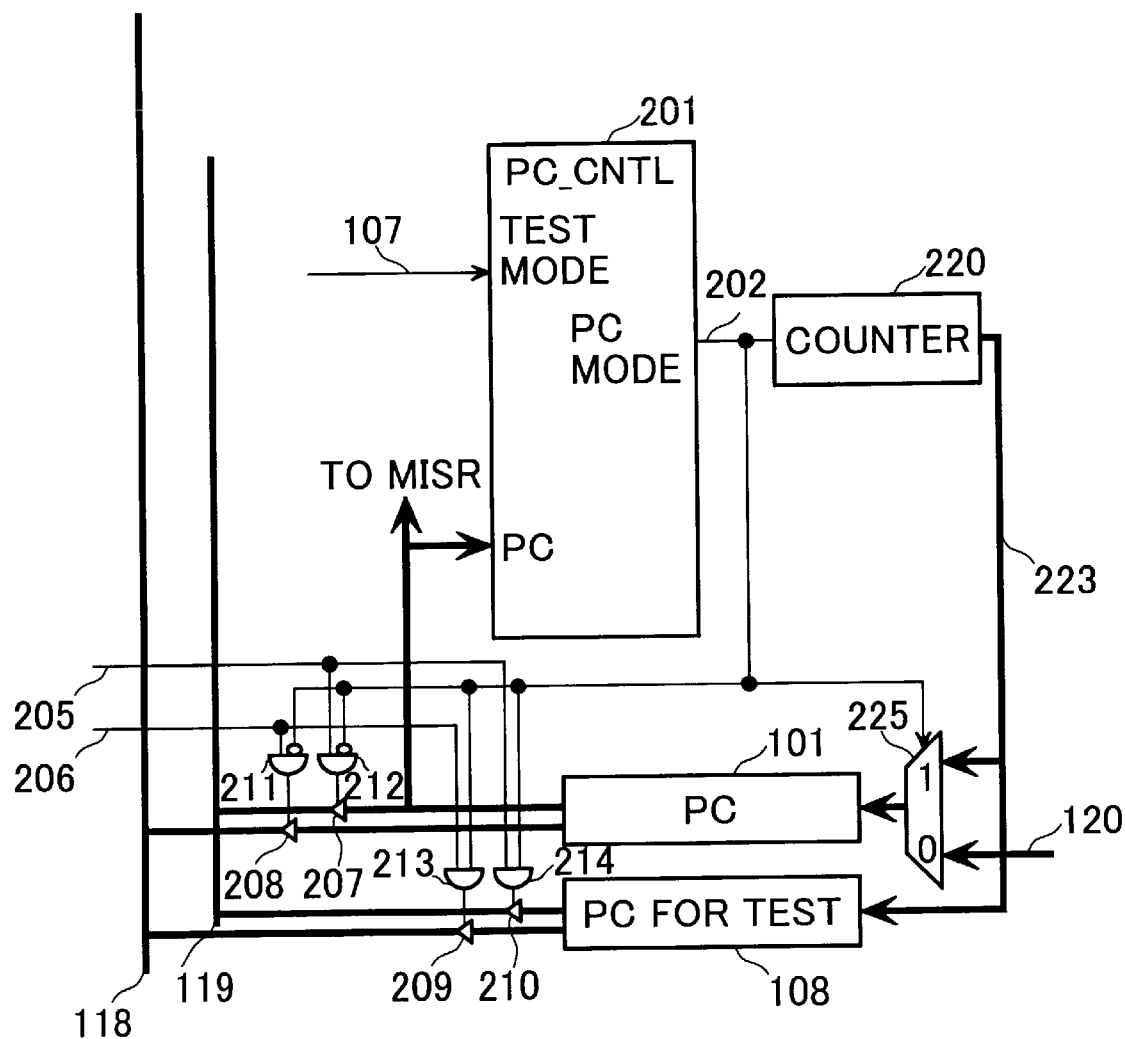
FIG. 5 is a diagram showing the configuration of a program counter switching section 109 according to still another embodiment of the present invention.

FIG. 5 is still another configuration of the program counter switching section 109. In the configuration of FIG. 5, a counter circuit 220 and a multiplexer logic 225 are added to the configuration of FIG. 4, wherein the counter circuit 220 counts the number of program counter switching signals 202, and the multiplexer logic 225 selectively inputs the output of the counter circuit 220 to the program counter 101 through a signal line 223.

The counter circuit 220 "counts up" using the program counter switching signal 202 as a trigger. The output of the counter circuit 220 is input to the test program counter 108. Furthermore, the same count value (the output value) is input to the program counter 101 through the signal line 223 and the multiplexer logic 225 when a "1" is output as the program counter switching signal 202. That is, the count value of the counter circuit 220 is used as an address value indicating an address of the memory 117. Each time the count value of the counter circuit 220 is updated, a new address of the memory 117 is input to the program counter 101 and the test program counter 108. When a "0" is output as the program counter switching signal 202, an ordinary address value transferred through the inter-register transfer bus 120 is input to the program counter 101.

In the configuration of FIG. 5, when an invalid address is stored in the program counter 101, the valid address in the test program counter 108 is used as the value of the program counter. Then, the address values of the program counter 101 and the test program counter 108 are updated to a same address value so that the contents of the program counter 101 is restored to a valid address value. When an invalid address is detected to be in the program counter 101, the current contents of the test program counter 108 is used as the value of the program counter, and its timing is the same as that of the ordinary operation. After the invalid address in the program counter 101 is taken into the signature compression circuit 110, the value of the program counter 101 is updated to a valid address. A plurality of valid addresses output from the counter circuit 220 can be used as the starting addresses of a plurality of test programs.

With this arrangement, when a series of test programs which include branch instructions and other instructions are executed, it is possible to return to a test program without causing exception processing to occur. For example, when executing a test program which carries out a branching step based on execution results of an operation instruction, it is possible to quickly proceed to the next program to be executed even if an invalid address (that is, an address out of the address space of the memory 117) has been specified. This can be done by re-setting the program counter 101 to a valid address. Since this arrangement uses the count value of the counter circuit 220 at that time, the destination of the test program to which to return is not fixed.

Figure 6:
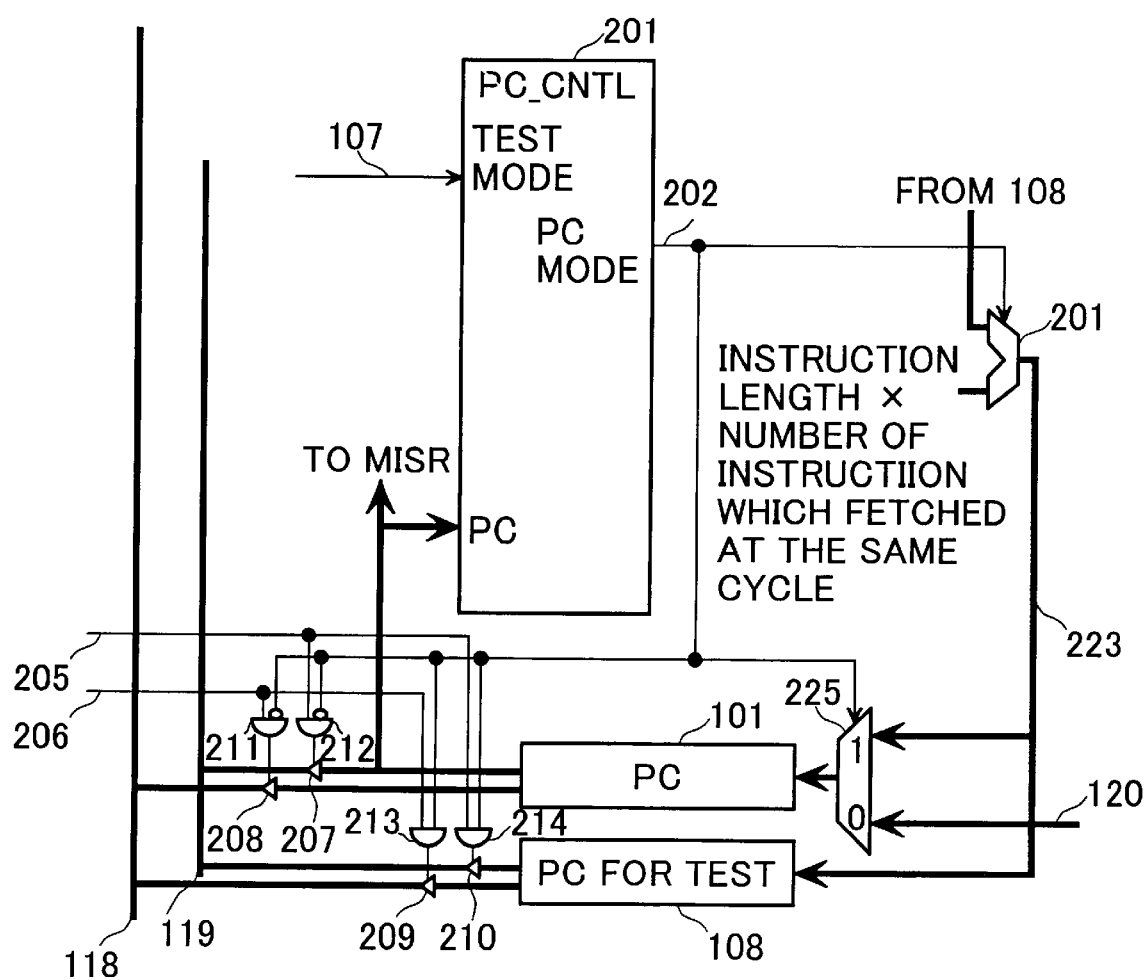
FIG. 6 is a diagram showing the configuration of a program counter switching section 109 according to yet another embodiment of the present invention.

FIG. 6 is a diagram showing yet another configuration of the program counter switching section 109. In the configuration of FIG. 6, an address adder 221 and the multiplexer logic 225 are added to the configuration of FIG. 4, wherein the address adder 221 performs an arithmetic operation using the program counter switching signal 202 as a trigger, and the multiplexer logic 225 selectively inputs the output of the adder 221 to the program counter 101 through the signal line 223.

The address adder 221 adds to the output of the test program counter 108 a constant obtained as a result of multiplying an instruction length by the number of instructions to be fetched, and inputs the result to the program counter 101 and the test program counter 108. For example, if the present processor employs 32-bit fixed-length instructions and a single-instruction fetch mechanism, the constant is 4 bytes, thereby indicating the next instruction in the memory 117. When an invalid address is stored in the program counter 101, and a "1" is output as the program counter switching signal 202, the valid address in the test program counter 108 is used as the value of the program counter. Then, the contents of the test program counter 108 is updated to indicate the next instruction in the memory 117, and the updated address value is stored in the program counter 101 and the test program counter 108. With this arrangement, the contents of the program counter 101 is restored to a valid address.

Figure 7:
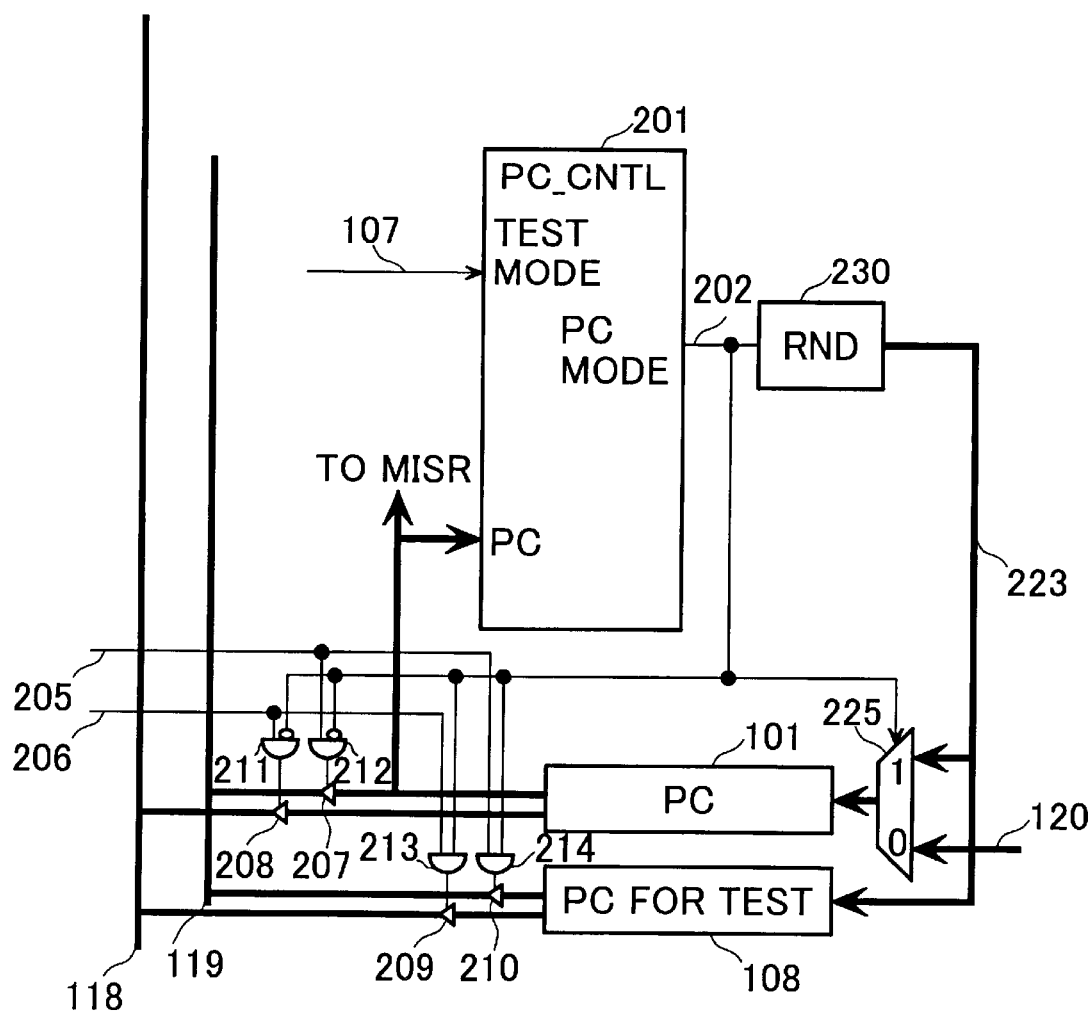
FIG. 7 is a diagram showing the configuration of a program counter switching section 109 according to still a further embodiment of the present invention.

FIG. 7 is a diagram showing still a further configuration of the program counter switching section 109. The configuration of FIG. 7 is different from that of FIG. 5 in that it employs a random number generating circuit (RND) 230 instead of the counter circuit 220. The random number generating circuit 230 generates a random number whose value is within the address space of the memory 117, using the program counter switching signal 202 as a trigger, and the generated random number is input to the program counter 101 and the test program counter 108. Use of the random number generating circuit 230 makes it possible to randomly select a plurality of addresses of the memory 117. By using these random addresses as the value of the program counter, it is possible to diversify the execution order of a program to detect occurrence of various faults.

It should be noted that as a method for increasing their operation speed, some processors are configured so that the value of the program counter 101 is directly output to the address bus 116 not through the memory data register 106. Also in this case, it is obviously possible to obtain the same effect by providing the program counter switching section 109 before the address bus 116.

According to the present invention described above, it is possible to perform a test without causing exception processing to occur, even using a test program which may generate an invalid address as a fetch address in a self test. In this case, the built-in self test can be performed at an ordinary operation speed by adding a minimum of an additional circuit to the semiconductor device.

Further, according to the present invention, it is possible to perform a test using various operand data without causing exception processing to occur.

Still further, according to the present invention, it is possible to restrict use of a test program counter to cases in which an invalid address has been specified, simplifying the setting of the test program counter.

Still further, according to the present invention, even when branching to an invalid address is specified, it is possible to re-set a program counter so as to quickly execute the program from a valid address.

Still further, according to the present invention, it is possible to randomly select an address to which to return after branching to an invalid address so as to diversify the execution order of a program and thereby detect occurrence of various faults.

What is claimed is:

1. A semiconductor device including an on-chip memory and a processor, said processor comprising:
    a program counter for storing an address in an address space of said on-chip memory and an external memory;
    a test program counter for storing an address in an address space of said on-chip memory;
    program counter switching means for, in a test mode, performing control in such a way that when an address of said on-chip memory is detected in said program counter, said address value in said program counter is selected as an address to be accessed in said on-chip memory, whereas when an address of said external memory is detected in said program counter, an address value of said test program counter is selected; and
    signature compression means for signature-compressing and holding an output value of said program counter.

2. The semiconductor device as claimed in claim 1, wherein said program counter switching means including:
    a control circuit for, in said test mode, outputting a first signal when said value of said program counter is detected to be within an address space of said on-chip memory, whereas outputting a second signal when said value of said program counter is detected to be out of an address space of said on-chip memory; and
    a multiplexer circuit for performing control in such a way that when said control circuit outputs said first signal, an output of said program counter is selected, whereas when said control circuit outputs said second signal, an output of said test program counter is selected.

3. The semiconductor device as claimed in claim 1, wherein said program counter switching means including:
    a control circuit for, in said test mode, outputting a first signal when said value of said program counter is detected to be within an address space of said on-chip memory, whereas outputting a second signal when said value of said program counter is detected to be out of an address space of said on-chip memory; and
    a gate circuit for selecting an output of said program counter when said control circuit outputs said first signal, whereas selecting an output of said test program counter when said control circuit outputs said second signal.

4. The semiconductor device as claimed in claim 1, wherein said program counter switching means including:
    a control circuit for, in said test mode, outputting a first signal when said value of said program counter is detected to be within an address space of said on-chip memory, whereas outputting a second signal when said value of said program counter is detected to be out of an address space of said on-chip memory;
    a gate circuit for selecting an output of said program counter when said control circuit outputs said first signal, whereas selecting an output of said test program counter when said control circuit outputs said second signal;
    a counter circuit for counting up each time said control circuit outputs said second signal;
    said test program counter for receiving an output of said counter circuit; and
    a multiplexer circuit for performing control in such a way that when said control circuit outputs said first signal, an output of an inter-register transfer bus is selected and input to said program counter, whereas when said control circuit outputs said second signal, an output of said counter circuit is selected and input to said program counter.

5. The semiconductor device as claimed in claim 1, wherein said program counter switching means including:
    a control circuit for, in said test mode, outputting a first signal when said value of said program counter is detected to be within an address space of said on-chip memory, whereas outputting a second signal when said value of said program counter is detected to be out of an address space of said on-chip memory;

a gate circuit for selecting an output of said program counter when said control circuit outputs said first signal, whereas selecting an output of said test program counter when said control circuit outputs said second signal;

random number generating means for generating a random number when said control circuit outputs said second signal;

said test program counter for receiving an output of said random number generating means; and a multiplexer circuit for performing control in such a way that when said control circuit outputs said first signal, an output of an inter-register transfer bus is selected and input to said program counter, whereas when said control circuit outputs said second signal, an output of said random number generating means is selected and input to said program counter.

6. The semiconductor device as claimed in claim 1, wherein said program counter switching means including:

a control circuit for, in said test mode, outputting a first signal when said value of said program counter is detected to be within an address space of said on-chip memory, whereas outputting a second signal when said value of said program counter is detected to be out of an address space of said on-chip memory;

a gate circuit for selecting an output of said program counter when said control circuit outputs said first signal, whereas selecting an output of said test program counter when said control circuit outputs said second signal;

an adder for adding an instruction length to an output value of said test program counter when said control circuit outputs said second signal;

said test program counter for receiving an output of said adder; and a multiplexer circuit for performing control in such a way that when said control circuit outputs said first signal, an output of an inter-register transfer bus is selected and input to said program counter, whereas when said control circuit outputs said second signal, an output of said adder is selected and input to said program counter.

7. The semiconductor device as claimed in claim 1, wherein said processor further comprising:

a memory address register for storing an address of said on-chip memory and an address of said external memory at a time of memory access;

a memory data register for storing input/output data at a time of memory access;

random number generating means for, in said test mode, supplying random number data to said memory data register; and a signature compression means for signature-compressing and holding an output value of said memory data register.

8. The semiconductor device as claimed in claim 7, wherein said program counter switching means including:

a control circuit for, in said test mode, outputting a first signal when said value of said program counter is detected to be within an address space of said on-chip memory, whereas outputting a second signal when said value of said program counter is detected to be out of an address space of said on-chip memory; and a multiplexer circuit for selecting an output of said program counter when said control circuit outputs said first signal, whereas selecting an output of said test program counter when said control circuit outputs said second signal.

9. The semiconductor device as claimed in claim 7, wherein said program counter switching means including:

a control circuit for, in said test mode, outputting a first signal when said value of said program counter is detected to be within an address space of said on-chip memory, whereas outputting a second signal when said value of said program counter is detected to be out of an address space of said on-chip memory; and a gate circuit for selecting an output of said program counter when said control circuit outputs said first signal, whereas selecting an output of said test program counter when said control circuit outputs said second signal.

10. The semiconductor device as claimed in claim 7, wherein said program counter switching means including:

a control circuit for, in said test mode, outputting a first signal when said value of said program counter is detected to be within an address space of said on-chip memory, whereas outputting a second signal when said value of said program counter is detected to be out of an address space of said on-chip memory;

a gate circuit for selecting an output of said program counter when said control circuit outputs said first signal, whereas selecting an output of said test program counter when said control circuit outputs said second signal;

a counter circuit for counting up each time said control circuit outputs said second signal;

said test program counter for receiving an output of said counter circuit; and a multiplexer circuit for performing control in such a way that when said control circuit outputs said first signal, an output of an inter-register transfer bus is selected and input to said program counter, whereas when said control circuit outputs said second signal, an output of said counter circuit is selected and input to said program counter.

11. The semiconductor device as claimed in claim 7, wherein said program counter switching means including:

a control circuit for, in said test mode, outputting a first signal when said value of said program counter is detected to be within an address space of said on-chip memory, whereas outputting a second signal when said value of said program counter is detected to be out of an address space of said on-chip memory;

a gate circuit for selecting an output of said program counter when said control circuit outputs said first signal, whereas selecting an output of said test program counter when said control circuit outputs said second signal;

random number generating means for generating a random number when said control circuit outputs said second signal;

said test program counter for receiving an output of said random number generating means; and a multiplexer circuit for performing control in such a way that when said control circuit outputs said first signal, an output of an inter-register transfer bus is selected and input to said program counter, whereas when said control circuit outputs said second signal, an output of said random number generating means is selected and input to said program counter.

12. The semiconductor device as claimed in claim 7, wherein said program counter switching means including:

a control circuit for, in said test mode, outputting a first signal when said value of said program counter is detected to be within an address space of said on-chip memory, whereas outputting a second signal when said value of said program counter is detected to be out of an address space of said on-chip memory;

a gate circuit for selecting an output of said program counter when said control circuit outputs said first signal, whereas selecting an output of said test program counter when said control circuit outputs said second signal;

an adder for adding an instruction length to an output value of said test program counter when said control circuit outputs said second signal;

said test program counter for receiving an output of said adder; and a multiplexer circuit for performing control in such a way that said control circuit outputs said first signal, an output of an inter-register transfer bus is selected and input to said program counter, whereas when said control circuit outputs said second signal, an output of said adder is selected and input to said program counter.

* * * * *